June 28, 1966 J. F. LAWRENCE, JR 3,258,707

VARIABLE GAIN AMPLIFIER SYSTEM UTILIZING A SOLID ELECTROLUMINESCENT CELL

Filed May 3, 1962

INVENTOR.
JAMES F. LAWRENCE, JR.
BY Forrest J. Lilly
ATTORNEY

United States Patent Office 3,258,707
Patented June 28, 1966

3,258,707

VARIABLE GAIN AMPLIFIER SYSTEM UTILIZING A SOLID ELECTROLUMINESCENT CELL

James F. Lawrence, Jr., 465 Sequoia Drive, Pasadena, Calif.

Filed May 3, 1962, Ser. No. 192,100
6 Claims. (Cl. 330—59)

My present invention relates generally to variable voltage attenuators, and more particularly, to an amplifier system including a variable voltage attenuator for varying the gain of the amplifier system as a function of the output voltage thereof.

As is well known, the gain of an audio compression and limiting amplifier is varied in accordance with the amplitude of the signal being amplified. The gain is normally reduced when the signal is large, and is increased when the signal is small. The gain of most compression and limiting amplifiers is controlled by a voltage which is used to vary the amplification of one or more amplifier stages of the amplifier. This control voltage is usually derived from a rectified portion of the output voltage of an amplifier stage and is used to vary the bias of another amplifier stage so that its amplification or gain decreases, for example, when the control voltage is large. Automatic control of audio level and reduction of audio peaks are achieved for such purposes as reducing volume range in recording sound, and preventing overmodulation of radio transmitters. Control obtained by varying bias, however, tends to increase the distortion generated in the controlled amplifier stage because the operating point of the amplifier stage is shifted from optimum.

In addition to providing a large amount of compression or limiting of audio signals with a minimum of waveform distortion, the criterion for a desirable audio compression and limiting amplifier includes fast response to audio peaks for efficient control thereof. Where bias is varied in order to increase or decrease amplification, careful circuit design including proper consideration of time constants of the components involved is required to secure rapid increase or decrease of amplification.

It is an object of my invention to provide a variable gain amplifier system in which large amounts of compression or attenuation of the signal being amplified are automatically achieved with little or no increase in waveform distortion.

Another object of the invention is to provide a variable gain amplifier system in which highly rapid and efficient control of the level of the signal being amplified is obtained.

A further object of the invention is to provide a variable gain amplifier system in which variation of bias and its attendant disadvantages in controlling gain are avoided.

A still further object of this invention is to provide a variable gain amplifier system wherein extremely large values of compression or attenuation of the signal being amplified are readily achieved.

Briefly, and in general terms, the foregoing and other objects are preferably accomplished by providing a variable gain amplifier system comprising a novel combination of a photoconductive network, an amplifier and a variable light source. An input signal is applied to the amplifier through the photoconductive network which includes one or more photoconductive cells placed in proximity to the variable light source. The amplifier produces an amplified system output signal from the input signal, and this output signal is also used to energize and control the light output of the variable light source. The light source is preferably a low power electroluminescent device which is characterized by instantaneous light response to applied voltage and substantially linear variation of light output with variation in applied voltage. The light source produces a variable light output which resistively varies the photoconductive network by means of photoconductive cells so as to vary the input signal applied thereto in accordance with the light output from the variable light source. An increased light output from the variable light source causes the photoconductive network to attenuate the input signal provided to the amplifier, and a decreased light output increases this input signal. The result is that the gain of the system is reduced with an increased system input signal, and the gain is increased with a decreased system input signal. A modified version of the photoconductive network causes the gain of the system to be increased with an increased system input signal, and decreased with a decreased system input signal.

My invention will be more fully understood, and other objects and advantages of the invention will become apparent, from the following description of a few illustrative embodiments of the invention to be taken in conjunction with the attached drawing, in which.

Figure 1:
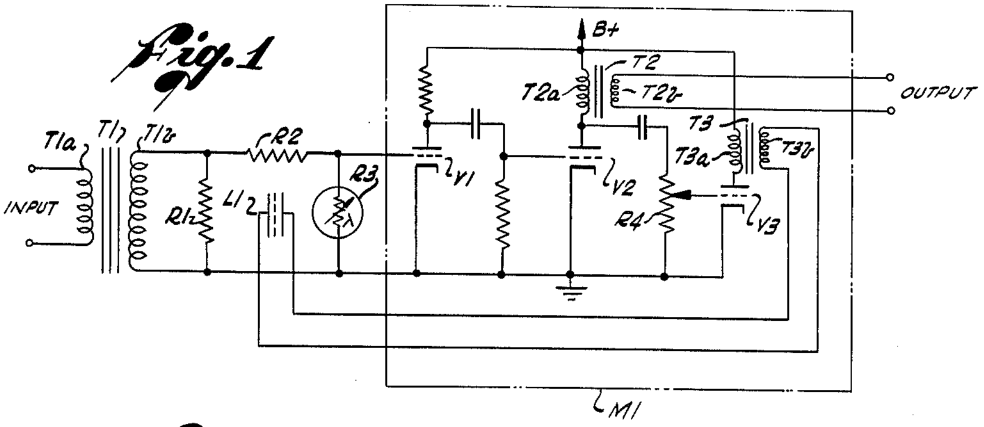
FIGURE 1 is a circuit diagram of a first embodiment of my invention.

A first embodiment of my invention is shown in FIGURE 1. An input signal, such as an audio voltage is applied to the primary winding T1*a* of an input transformer T1. This audio voltage is transformed and appears across the secondary winding T1*b* of the input transformer T1. A resistor R1 of, for example, 100 kilohms, is connected across the secondary winding T1*b* to provide a constant load on the transformer T1 to preserve a proper transformer primary impedance. A series combination of resistor R2 and photoconductive cell R3 is connected across the secondary winding T1*b* and serves as a voltage divider, the output of which is applied to the control grid of amplifier tube V1. The resistor R2 is, for example, a 1 megohm resistor, and the resistor R3 is preferably a photoconductive cell whose resistance may range from many megohms in darkness to only a few hundred ohms when excited by light. The voltage across the photoconductive cell R3 applied to the tube V1 is proportional to the resistance value of photoconductive cell R3, since the resistor R2 remains constant in value.

The output voltage from tube V1 is preferably further amplified by amplifier tube V2 and applied to the primary winding T2*a* of the output transformer T2. A system output signal is obtained from the secondary winding T2*b* of the transformer T2. The output voltage from tube V2 is also applied to amplifier tube V3 through a potentiometer R4. The output voltage of the tube V3 is applied to the primary winding T3*a* of the transformer T3. The secondary winding T3*b* of the transformer T3 is connected to a variable light source L1 which is preferably an electroluminescent device or other low power, linear light source having essentially instantaneous response to applied voltage and located in proximity to the photoconductive cell R3. The photoconductive cell R3 is thus exposed to light from the electroluminescent device L1.

The light output from the electroluminescent device L1 is dependent upon the voltage developed across the secondary winding T3*b* of the transformer T3. This voltage in turn is dependent upon the output voltage from tube V3, and is therefore proportional to the amplified output voltage of the tube V2. Since the output from the tube V2 is applied to the output transformer T2, the light output from the electroluminescent device L1 is also proportional to the system output signal from the secondary winding T2*b* of the output transformer T2.

As the audio voltage applied to the input transformer T1 is increased, the amplified output voltage from the tube V2 will tend to increase a certain amount so that the output voltage from the tube V3 and transformer T3 will also tend to increase a certain amount. Since the output voltage of the transformer T3 is supplied to the electroluminescent device L1, the resulting increase in light will reduce the resistance of the photoconductive cell R3 such that a lower voltage is applied to the tube V1. The amplified output voltage from the tube V2 and from the output transformer T2 thus will not be increased the full amount for the increase of the audio voltage applied to transformer T1. Since the system output voltage from the output transformer T2 is not increased a full amount for the increased voltage to the input transformer T1, the gain of the system is reduced with an increased input signal. The adjustment setting of potentiometer R4 determines the amount of gain reduction which is to take place in the system.

Figure 2:
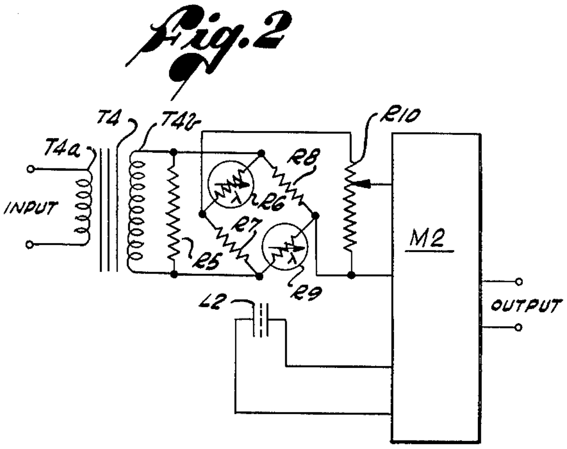
FIGURE 2 is a circuit diagram of a second embodiment of the invention.

A second embodiment of this invention is shown in FIGURE 2. Two photoconductive cells are utilized in conjunction with a variable light source in an arrangement which has increased sensitivity and is capable of complete decrease in output signal regardless of the minimum resistance capability of the photoconductive cells. The input transformer T4 in FIGURE 2 corresponds to the input transformer T1 of FIGURE 1. An input signal is applied to the primary winding T4*a* of the input transformer T4 and an output voltage is obtained across the secondary winding T4*b*. A resistor R5 is connected across the secondary winding T4*b*, as shown in FIGURE 2. The resistor R5 is provided for the same reason as the resistor R1, and is similar in value to the resistor R1.

The ends of a bridge circuit having two parallel branches are connected to respective ends of the secondary winding T4*b*. One branch of the bridge circuit is formed from a series combination of a photoconductive cell R6 connected in an upper arm of the branch and a resistor R7 connected in a lower arm. The other branch is formed from a series combination of a resistor R8 connected in an upper arm of this branch and another photoconductice cell R9 connected in a lower arm. A potentiometer R10 is connected between the centers of the two branches of the bridge circuit, and the output from the potentiometer is applied to an amplifier tube (not shown) corresponding to the tube V1 of FIGURE 1 in the block M2.

The circuitry of the block M2 is identical to that in the block M1 of FIGURE 1, and has not been repeated in FIG. 2. An output from the block M2 is obtained from an output transformer (not shown) in block M2 corresponding to transformer T2 of block M1 in exactly the same manner as shown in FIGURE 1. Similarly, the electroluminescent device L2 from the block M2 is connected to another transformer (not shown) in the block M2 corresponding to the transformer T3 of block M1 in exactly the same manner as shown in FIGURE 1. The electroluminescent device L2 is positioned in proximity to the photoconductive cells R6 and R9 so as to illuminate these cells equally.

The values of both the resistor R5 and the potentiometer R10 are 100 kilohms, and the values of the resistors R7 and R8 are 10 kilohms, for example. When an input signal is applied to the input transformer T4, an appropriate voltage is produced across the potentiometer R10 and an appropriate light output from the electroluminescent device L2 is provided on the photoconductive cells R6 and R9 so that a properly reduced amplified output signal is obtained from the output of the block M2 in a manner similar to that for the circuit of FIGURE 1. As the input voltage to the transformer T4 is increased a certain amount, a greater output votlage from the potentiometer R10 will tend to increase the amplified output signal from the block M2 a certain amount. As before, however, the light output from the electroluminescent device L2 is increased to reduce the resistance of the photoconductive cells R6 and R9. The result is that the output voltage from the potentiometer R10 is correspondingly reduced so that the amount of increase in the amplified output signal from the block M2 is reduced a desired amount (as set by a potentiometer in block M2 corresponding to potentiometer R4 in block M1 of FIGURE 1) for the corresponding increase of the input voltage to the input transformer T4. That is, the gain of the system is reduced with an increased input signal to transformer T4.

When the increase in input voltage to the input transformer T4 is such that the light output from the electroluminescent device L2 is increased to a point where the resistance of the cell R6 is equal to that of the resistor R8, and the resistance of cell R9 is equal to that of resistor R7, then the bridge is in balance and the voltage applied to the potentiometer R10 is zero. The valuues of the resistors R7 and R8 are selected low enough so that the resistances of the cells R7 and R9 do not become less than that of the resistors to cause unbalance of the bridge by very high light outputs on the cells. The output signal from the block M2 is therefore reduced to zero for large increases of the input signal to the input transformer T4. In effect, infinite attenuation has been achieved, even though the resistances of the photoconductive cells R6 and R9 have remained finite. It is thus seen that the gain of the system shown in FIGURE 2 is increasingly reduced for increasing input signals being amplified, and for very large input signals, the gain is effectively reduced to zero so that an output signal will not be obtained from the block M2. In practice, however, this condition is only approached, since some signal must pass through the amplifiers to excite the electroluminescent device L2.

Figures 3, 4, 6:
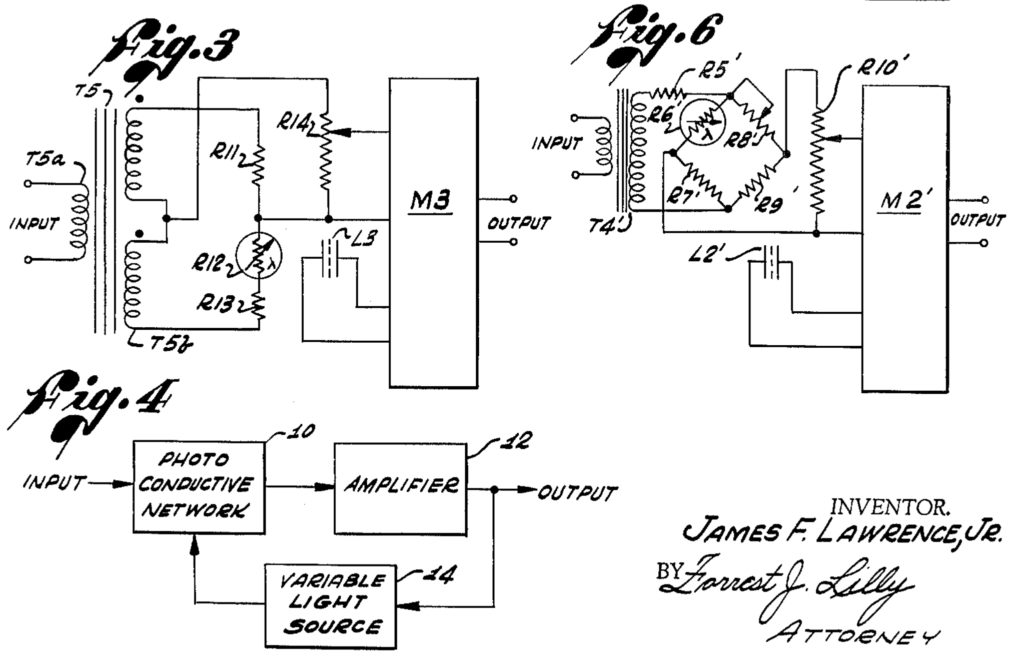
FIGURE 3 is a circuit diagram of a third embodiment of the invention.
FIGURE 4 is a generalized block diagram of my invention.
FIGURE 6 is a circuit diagram of a variation of the circuit of FIGURE 2.

A third embodiment of the invention is shown in FIGURE 3. The circuit of FIGURE 3 uses a method of voltage cancellation to achieve large values of attenuation, but requires only a single photoconductive cell. The input transformer T5 has a primary winding T5*a* and a split secondary winding T5*b*. A series combination of a resistor R11, photoconductive cell R12, and resistor R13 is connected to the ends of the split secondary winding T5*b* and a potentiometer R14 is connected to the center of split secondary winding T5*b* and to the common junction between the resistor R11 and the photoconductive cell R12. The output from the potentiometer R14 is applied to an amplifier tube (not shown) in the block M3, corresponding to transformer T2 in the block M1 of FIGURE 1. Similarly, the electroluminescent device L3 is connected to another transformer (not shown) in the block M3 corresponding to the transformer T3 in the block M1 of FIGURE 1.

The split secondary winding T5*b* is wound and connected so that when an input voltage is applied to the primary winding T5*a*, an additive voltage from end to end of the split secondary winding T5*b* is obtained and applied across the series combination of resistor R11, photoconductive cell R12, and resistor R13. Thus, equal and opposite voltages are obtained at the ends of the split secondary winding T5*b* when considered with respect to the center thereof. It can be seen that if the combined resistances of photoconductive cell R12 and resistor R13 are equal to the resistance of resistor R11, the potentials at the ends of the potentiometer R14 will be equal, and the voltage applied thereto is zero. The resistance of the photoconductive cell R12 need decrease only to such a value that its resistance plus that of resistor R13 equals the resistance of resistor R11, and infinite attenuation of the input signal to transformer T5 is effectively obtained. In practice, however, this condition will be only approached, since some signal must pass through the amplifiers to excite the electroluminescent device L3.

The operation of the circuit of FIGURE 3 is generally similar to that of the circuit of FIGURES 1 and 2. When an input signal is applied to the input transformer T5, equal and opposite voltages appear at the ends of the split secondary winding T5*b* relative to the center thereof. The loop currents due to their respective opposing voltages of the two halves to the split secondary winding T5*b* are varied in magnitude according to their loop resistances and are differentially combined in the potentiometer R14. A resultant voltage is developed across the potentiometer R14 and an output voltage therefrom is applied to the block M3 to produce an output signal at the output thereof. This output signal, of course, includes the effect of the light output from the electroluminescent device L3 on the photoconductve cell R12 decreasing its resistance a certain amount. When the input signal to the input transformer T5 increases, the equal and opposite voltages at the ends of the split secondary winding T5*b* increase to produce a greater output voltage from the potentiometer R14. The light output from the electroluminescent device L3 is also increased to decrease the resistance of the photoconductive cell R12. This produces a decreased output voltage from the potentiometer R14 such that an output signal which is appropriately reduced a desired amount is obtained at the output of the block M3. The gain of the system is thus effectively reduced for an increased input signal to the transformer T5.

When the input signal to the input transformer T5 is sufficiently large to cause the light output from the electroluminescent device L3 to increase to a point where the resistance of the photoconductive cell R12 is decreased so that its resistance in combination with that of the resistor R12 is substantially equal to the resistance of the resistor R11, the voltage across the potentiometer R14 approaches zero so that the output signal from the block M3 is greatly reduced. The resistance of the resistor R11 is preferably selected to approximately equal the minimum operating resistance of the cell R12 combined with that of the resistor R13 so that the voltage across the potentiometer R14 will not increase again after it is made nearly zero by the increasing input signal. The gain of the system of FIGURE 3 is thus reduced with increasing input voltages to the system, and increased with decreasing input voltages thereto.

A block diagram of my invention is shown in FIGURE 4. This block diagram is, of course, applicable to all three embodiments of the invention as described above. An input signal is applied to a photoconductive network 10 and the output of the network 10 is applied to an amplifier 12 which produces an amplified system output signal. The output of the amplifier 12 is also applied to a variable electroluminescent light source 14, which proproduces a light output that regulates the photoconductive network 10 so that the output from the network 10 is varied according to the light output from the variable light source 14. Since the light output from the variable light source 14 is dependent upon the output of the amplifier 12, the output from the photoconductive network 10 is being varied according to the input signal to the network 10.

The gain of the system is reduced by having an increasing output signal from the amplifier 12 produce an increasing light output from the variable light source 14 to regulate the photoconductive network 10 such that a reduced output is obtained from the network 10. The input signal to the amplifier 12 is thus reduced to produce a lower amplified system output signal. The gain of the system is effectively reduced for an increased input signal and the network 10 is therefore a variable attenuator which increasingly attenuates an input signal to be amplified as the input signal increases in magnitude.

The photoconductive network 10 corresponds to the voltage divider including resistor R2 and photoconductive cell R3 in FIGURE 1. In FIGURE 2, the bridge circuit including the resistor R7 and R8 and the photoconductive cells R6 and R9 corresponds to the photoconductive network 10 of FIGURE 4. In FIGURE 3, the network connected to the split secondary winding T5*b* and including the resistors R11 and R13 and the photoconductive cell R12, broadly corresponds to the photoconductive network 10 of FIGURE 4. Since the secondary winding of the input transformer T5 in FIGURE 3 is a split secondary winding T5*b*, the center of which is connected to one end of the potentiometer R14, the photoconductive network 10 indicated in FIGURE 4 actually includes the split secondary winding as part of the network 10.

The input signal indicated in FIGURE 4 would generally correspond to the voltage across the secondary windings of the input transformers T1, T4 and T5 of FIGURES 1, 2 and 3. The amplifier 12 corresponds to the two-stage amplifier including tubes V1 and V2 of FIGURE 1, and similarly in FIGURES 2 and 3, since the blocks M2 and M3 are identical in circuitry to the block M1 of FIGURE 1. The variable light source 14 of FIGURE 4, of course, corresponds to the electroluminescent devices L1, L2 and L3 of FIGURES 1, 2 and 3 respectively.

Figure 5:
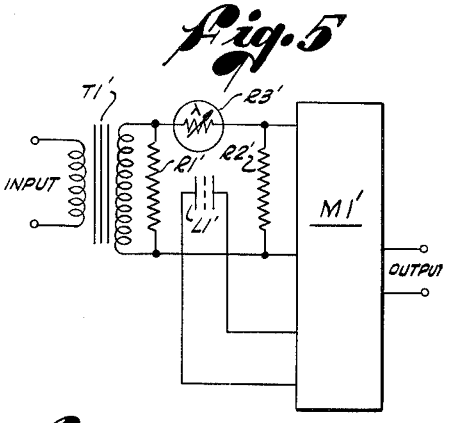
FIGURE 5 is a circuit diagram of a variation of the circuit of FIGURE 1.

The photoconductive network 10 of FIGURE 4 can be constructed so that an increasing light output from the variable light source 14 will cause an increasing output from the network 10. This can be accomplished, of example, by interchanging positions of the resistor R2 and the photoconductive cell R3 in the voltage divider of FIGURE 1. FIGURE 5 illustrates the resulting circuit. Resistor R2′ and photoconductive cell R3′ are the interchanged elements. When the resistance of the cell R3′ is decreased with an increased light output from the electroluminescent device L1′, the voltage across resistor R2′ increases to produce a greater output signal from block M1′. The circuitry in block M1′ is, of course, identical to that in block M1 of FIGURE 1. In this variation of the circuit of FIGURE 1, the gain of the system is increased with an increased input signal to the system. The amplified output signals from the amplifier 12 will be progressively increased with an increasing input signal to the photoconductive network 10. The system then functions as an expander which expands the input signals to the system.

A variation of the circuit of FIGURE 2 is shown in FIGURE 6. The bridge circuit used requires only a single photoconductive cell R6′. The resistors R7′ and R9′ are fixed resistances of, for example 70 kilohms. The resistor R8′ is adjustable and is preferably set to a low value. The limiting resistor R5′ is, for example, 10 kilohms. The remainder of the circuit of FIGURE 5 is similar to that of FIGURE 2.

When the resistance of the cell R6′ becomes equal to the resistance of resistor R8′, the voltage drop across the potentiometer R10′ is substantially zero so that no input voltage is provided to the block M2′ for amplification. As noted previously, this condition is only approached since some signal must pass through the amplifiers in block M2′ to excite the electroluminescent device L2′. In order to prevent further bridge unbalance or reversal following the equalling of resistances of cell R6′ and resistor R8′ due to further decrease in resistance of the cell R6′ to a value less than that of R8′, the resistance of R8′ is adjusted to a value lower than that to which the cell R6′ can ever reach. In fact, the resistance of resistor R8′ is preferably adjusted to zero in the circuit of FIGURE 6.

Variable gain amplifier systems according to this invention are desirably used to control the left and right signals in a stereo system. The two variable gain amplifiers are essentially independently associated with their respective left and right signals except that the electroluminescent devices of the variable gain amplifiers are connected in parallel. Thus, any variation of the signal being amplified by one amplifier will not only affect the gain of that particular amplifier but also the gain of the other amplifier.

Each of the electroluminescent devices and their respectively associated photoconductive cells are, of course, mounted and contained in a suitably closed housing. The advantages of using an electroluminescent material or device as a light source are that its light output is in direct linear proportion to the exciting voltage as well as very fast action or response, and that no thermal lag exists as would be the case of an incandescent light source. It is also apparent, however, that other types of light-producing devices which produce an increasing light output for an increasing signal applied thereto can be used in place of the electroluminescent devices. Thus, it is to be understood that the particular embodiment of the invention described above and shown in the drawing are merely illustrative of, and not restrictive on my broad invention, and that various changes in design, structure, and arrangement may be made without departing from the spirit and scope of the broader of the appended claims.

I claim:

1. A network having its gain controlled in response to the amplitude of an input signal source applied thereto comprising a constant, predetermined gain amplifier having the input terminals thereof responsive to said signal source for deriving an output that is a replica of the signal at said input terminals, a solid electroluminescent light source coupled to the amplifier output and responsive to a voltage that is a replica of the amplifier output, the light intensity deriving from said light source being substantially linearly related to the amplitude of the voltage applied thereto and responding substantially simultaneously to the variations in the amplitude of the voltage applied thereto, an attenuating network connected to said input terminals for coupling the signal of said signal source to said input terminals, said attenuating network including a photoconductive resistive element optically coupled to be responsive to the light deriving from said light source.

2. The network of claim 1 wherein said photoconductive element is connected in shunt with the input terminals of said amplifier.

3. The network of claim 1 wherein said photoconductive element is connected in series between one input terminal of said amplifier and a terminal of said signal source.

4. The network of claim 1 wherein said attenuating network includes a bridge having a pair of branches across each of which the voltage deriving from said signal source is developed, the opposite ends of said branches being connected together by a pair of common terminals, each of said branches including impedance means having a tap, and means for coupling the voltage between said taps to said input terminals, said photoconductive element being connected in one of said branches between one of said input terminals and one of said common terminals.

5. The network of claim 4 further including another photoconductive resistive element optically coupled to be responsive to the light deriving from said light source in substantially the same manner as the other named photoconductive element, said another photoconductive element being connected in the other of said branches between the other one of said input terminals and the other of said common terminals.

6. The network of claim 4 wherein one of said branches comprises a tapped transformer winding responsive to said signal source, and the other branch comprises: a first resistance in series with said photoconductive element and connected between said one input terminal and said one common terminal, and a second resistance connected bebetween said one input terminal and the other of said common termianls.

References Cited by the Examiner

UNITED STATES PATENTS

| | | | |
|---|---|---|---|
| 2,836,766 | 5/1958 | Halsted. | |
| 3,020,488 | 2/1962 | De Miranda et al. ---- | 330—59 |
| 3,167,722 | 1/1965 | Weller -------------- | 330—59 |

ROY LAKE, *Primary Examiner.*

N. KAUFMAN, *Assistant Examiner.*